US012647082B2

(12) United States Patent
Pattipaka et al.

(10) Patent No.: US 12,647,082 B2
(45) Date of Patent: Jun. 2, 2026

(54) LINEARITY CORRECTION IN HIGH VOLTAGE TRANSMIT SWITCHES

(71) Applicant: Texas Instruments Incorporated, Dallas, TX (US)

(72) Inventors: Ravikumar Pattipaka, Bangalore (IN); Raja Sekhar, Bangalore (IN); Sandeep Oswal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 553 days.

(21) Appl. No.: 18/193,243

(22) Filed: Mar. 30, 2023

(65) Prior Publication Data

US 2024/0243714 A1 Jul. 18, 2024

Related U.S. Application Data

(60) Provisional application No. 63/438,832, filed on Jan. 13, 2023.

(51) Int. Cl.
| | |
|---|---|
| *H03F 3/45* | (2006.01) |
| *H03F 1/32* | (2006.01) |
(Continued)

(52) U.S. Cl.
CPC ....... *H03F 3/45475* (2013.01); *H03F 1/3211* (2013.01); *H03F 3/245* (2013.01);
(Continued)

(58) Field of Classification Search
CPC .... H03F 3/45475; H03F 3/245; H03F 1/3211; H03G 3/3042; H04B 1/04; H04B 2001/0408; H04B 2001/485
(Continued)

(56) References Cited

U.S. PATENT DOCUMENTS

| | | | | |
|---|---|---|---|---|
| 2011/0242145 A1* | 10/2011 | Nishimura | ........... | G09G 3/3688 330/257 |
| 2015/0091646 A1* | 4/2015 | Shifrin | ................ | H03F 3/45183 330/255 |
| 2019/0123696 A1* | 4/2019 | Liu | ........................... | H03F 1/26 |

FOREIGN PATENT DOCUMENTS

| | | | |
|---|---|---|---|
| CN | 100405718 C | * | 7/2008 |
| CN | 103618506 A | * | 3/2014 |
(Continued)

OTHER PUBLICATIONS

Zhang et al., Integrated Circuits for Medical Ultrasound Applications: Imaging and Beyond, Oct. 2021, IEEE Transactions on Biomedical Circuits and Systems, vol. 15 (Year: 2021).*
(Continued)

*Primary Examiner* — Andrea Lindgren Baltzell
*Assistant Examiner* — Lance Torbjorn Bartol
(74) *Attorney, Agent, or Firm* — Xianghui Huang; Frank D. Cimino

(57) ABSTRACT

An ultrasonic transmitter including a linear amplifier, an output stage, a switch, and a current compensation circuit. The linear amplifier includes first and second amplifier stages. The output stage has an input coupled to an output of the linear amplifier, and presents the transmitter output. The switch is coupled to the output of the linear amplifier. The current compensation circuit has an output coupled at the output of the first amplifier stage. Select circuitry is configured to couple the switch to a bias terminal when the switch is closed, and to couple one or more nodes of the switch to the control terminal of the current compensation circuit when the switch is open. The current compensation circuit generates a compensation current responsive to a sensed non-linear current conducted through the switch when open.

20 Claims, 9 Drawing Sheets

(51) Int. Cl.
   *H03F 3/24*        (2006.01)
   *H03G 3/30*        (2006.01)
   *H04B 1/04*        (2006.01)
   *H04B 1/48*        (2006.01)

(52) U.S. Cl.
   CPC ............. *H03G 3/3042* (2013.01); *H04B 1/04*
        (2013.01); *H04B 2001/0408* (2013.01); *H04B*
                                *2001/485* (2013.01)

(58) Field of Classification Search
   USPC ........................................................... 330/9
   See application file for complete search history.

(56)                References Cited

FOREIGN PATENT DOCUMENTS

CN          110716602 A  *  1/2020  .............. G05F 1/56
CN          210351102 U  *  4/2020

OTHER PUBLICATIONS

Gak, Integrated switches for implantable medical devices, in HV-MOS technology, Jan. 2010, Research Gate (Year: 2010).*

* cited by examiner

702 — INITIATE TRANSMIT INTERVAL

704 — OPEN HIGH VOLTAGE SWITCH

706 — SENSE AC CURRENT CONDUCTED BY THE HIGH VOLTAGE SWITCH WHEN OPEN

708 — GENERATE COMPENSATION CURRENT AT INPUT OF TRANSMITTER DRIVER STAGE RESPONSIVE TO THE SENSED AC CURRENT

710 — AT END OF TRANSMIT INTERVAL, CLOSE HIGH VOLTAGE SWITCH TO COUPLE IT TO A BIAS VOLTAGE

LINEARITY CORRECTION IN HIGH VOLTAGE TRANSMIT SWITCHES

CROSS-REFERENCE TO RELATED APPLICATIONS

This application claims priority, under 35 U.S.C. § 119(e), of U.S. Provisional Application No. 63/438,832, filed Jan. 13, 2023, said provisional application incorporated herein by reference in its entirety.

BACKGROUND

This relates to linear amplifiers for generating high frequency signals at high voltages and currents, for example as applied to ultrasonic sensing systems.

Ultrasonic sensing systems, such as used in the field of medical imaging, involve actuating a transducer to produce ultrasonic waves into a target medium, and sensing reflections or echoes of the produced ultrasonic waves from structures in the target medium. In some implementations, the same transducer that imparts the ultrasonic waves also senses reflections of those waves. In those implementations, the ultrasonic system includes both transmitter and receiver circuitry, with a "transmit/receive" switch that isolates the receiver from the transmitter during transmission.

Transmitter circuitry in ultrasonic sensing systems may include an output stage. FIG. 1A illustrates the arrangement of a prior art ultrasonic transmitter 100. In this example, signal source 101 generates a time-varying signal, for example a sinusoidal or square wave signal at one or more frequencies. That time-varying signal is applied to one input of transconductance amplifier 102. Transconductance amplifier 102 receives a feedback signal at another input. Transconductance amplifier 102 generates an output current that is applied to high voltage driver stage 104. Driver stage 104 amplifies the signal at its input to high voltage levels (e.g., +90V), and applies the amplified signal to an input of output stage 106. Transconductance amplifier 102 and driver stage 104 can together be considered as a linear amplifier 105. Output stage 106 drives an output signal TXOUT at the desired current and voltage levels. In an ultrasonic sensing system, output signal TXOUT is applied to a transducer input. Compensation capacitor 111 is coupled between the input of output stage 106 and circuit ground. A feedback network of resistors 107, 109 provides feedback from the output of output stage 106 to transconductance amplifier 102.

To minimize glitches due to power-down and power-up of the amplifier stages, transmitter 100 includes a high-voltage switch 110. Switch 110 is controlled to be open during transmit intervals and closed during power-down and receive intervals. When closed, switch 110 couples a bias voltage VBIAS to the output of linear amplifier 105 at node HVSWIN. This bias voltage VBIAS is selected to maintain the output of linear amplifier 105 at a potential that limits output glitches as the transmitter circuitry powers up at the start of the next transmit interval.

FIG. 1B illustrates the construction of prior art high voltage switch 110. Switch 110 of FIG. 1B includes complementary legs connected between node HVSWIN at the output of linear amplifier 105, and node HVSWOUT that receives bias voltage VBIAS. A first leg includes n-channel metal-oxide-semiconductor (MOS) transistor 120 and p-channel MOS (PMOS) transistor 124 with source/drain paths coupled in series between node HVSWIN and node HVSWOUT. NMOS transistor 120 has its drain coupled to node HVSWIN and PMOS transistor 124 has its source coupled to node HVSWOUT. PMOS transistor 122 couples a control signal CTRL_1 to the gate of NMOS transistor 120, in response to control signal CTRL_3 applied to its gate. The gate of PMOS transistor 124 receives a control signal CTRL_2. Zener protection diode 123 has its cathode at the gate of NMOS transistor 120 and its anode at a mid node MIDL at which the source of NMOS transistor 120 is connected to the drain of PMOS transistor 124.

The second, complementary, leg of switch 110 similarly includes a PMOS transistor 130 and NMOS transistor 134 with source/drain paths coupled in series between node HVSWIN and node HVSWOUT. This second leg is reversed from the first leg of high voltage switch 110, with PMOS transistor 130 having its drain coupled to node HVSWIN and NMOS transistor 134 having its source coupled to node HVSWOUT. 2 NMOS transistor 132 couples a control signal CTRL_4 to the gate of PMOS transistor 130, in response to control signal CTRL5 at its gate. The gate of NMOS transistor 134 receives a control signal CTRL_6. Zener protection diode 133 has its anode at the gate of PMOS transistor 120P and its cathode at mid node MIDR, at which the source of PMOS transistor 130 is connected to the drain of NMOS transistor 134. During receive intervals, switch 110 is closed in response to control signals CTRL_1 through CTRL_6 being driven to the appropriate levels to turn on transistors 120, 122, 124, 130, 132, and 134. When closed, bias voltage VBIAS at node HVSWOUT is coupled to node HVSWIN through the pair of transistors 120 and 124, and the pair of transistors 130 and 134. Conversely, switch 110 is open during transmit intervals in response to control signals CTRL_1 through CTRL6 being driven to the appropriate levels to turn off 120, 122, 124, 130, 132, and 134.

SUMMARY

In an example, an ultrasonic transmitter includes a linear amplifier, an output stage, a switch, and a current compensation circuit. The linear amplifier includes a first amplifier stage having a signal input and a feedback input, and a second amplifier stage having an input coupled to an output of the first amplifier stage. The output stage has an input coupled to output of the linear amplifier, and presents the transmitter output. The switch is coupled to the output of the linear amplifier. The current compensation circuit has an output coupled to the output of the first amplifier stage. Select circuitry is configured to couple the switch to a bias terminal responsive to the switch being closed, and to couple one or more nodes of the switch to the control terminal of the current compensation circuit responsive to the switch being open.

In another example, an ultrasonic transceiver system includes a transducer, ultrasonic receiver circuitry coupled to the transducer, ultrasonic transmitter circuitry having an output coupled to the transducer, and a transmit/receive switch, configured to isolate the ultrasonic receiver circuitry from the ultrasonic transmitter circuitry while the ultrasonic transmitter circuitry is transmitting. The ultrasonic transmitter includes a linear amplifier, an output stage, a switch, and a current compensation circuit. The linear amplifier includes a first amplifier stage having a signal input and a feedback input, and a second amplifier stage having an input coupled to an output of the first amplifier stage. The output stage has an input coupled to output of the linear amplifier, and presents the transmitter output. The switch is coupled to the output of the linear amplifier, and is selectively opened and closed by control circuitry. The current compensation circuit has an output coupled to the output of the first amplifier stage. Select circuitry is configured to couple the switch to a bias terminal responsive to the switch being closed, and to couple one or more nodes of the switch to the control terminal of the current compensation circuit responsive to the switch being open.

In another example, a method of transmitting an ultrasonic signal to a transducer during a transmit interval is provided. The method includes applying an input signal to a transconductance amplifier, amplifying an output signal from the transconductance amplifier at an input of a driver stage, and applying the amplified output signal to an output stage. The method further includes opening a switch coupled between the output of the driver stage and a bias voltage terminal, sensing a current conducted by the switch when open, and generating a compensation current at the input of the driver stage responsive to the sensed current.

Technical advantages enabled by one or more of these examples include improved linearity in ultrasonic transmitters, resulting from the injection of a compensation current at a low voltage node, for example at the input of a high voltage driver stage. In some implementations, the improved linearity and compensation can be realized with minimal additional chip area and power consumption.

Other technical advantages enabled by the disclosed examples will be apparent to those of ordinary skill in the art having reference to the following specification together with its drawings.

BRIEF DESCRIPTION OF THE DRAWINGS

The same reference numbers or other reference designators are used in the drawings to illustrate the same or similar (in function and/or structure) features.

DETAILED DESCRIPTION

Piezoelectric ultrasonic transducers tend to be inefficient from the standpoint of the mechanical ultrasonic energy generated from the electrical energy applied by the transmitter output circuitry. This inefficiency can require the transmitter circuitry to output signals at high voltages (e.g., on the order of 180 V peak-to-peak) and high currents (e.g., on the order of 6 A peak-to-peak) to generate the ultrasonic energy necessary for imaging. In addition, to attain high resolution images, the ultrasonic frequencies of interest can be as high as 25 MHz.

The reflections of interest to be sensed by the ultrasonic receiver from structures in the target medium generally correspond to the second harmonic of the imparted ultrasonic waves. The electrical signal amplitude from these sensed reflections may be quite low as compared with the transmitter output, for example at levels on the order of 500 mV peak-to-peak. This low signal amplitude places stringent limits on the linearity of the transmitter to minimize distortion in the transmitted signal that can mask true reflections.

Figure 2A:
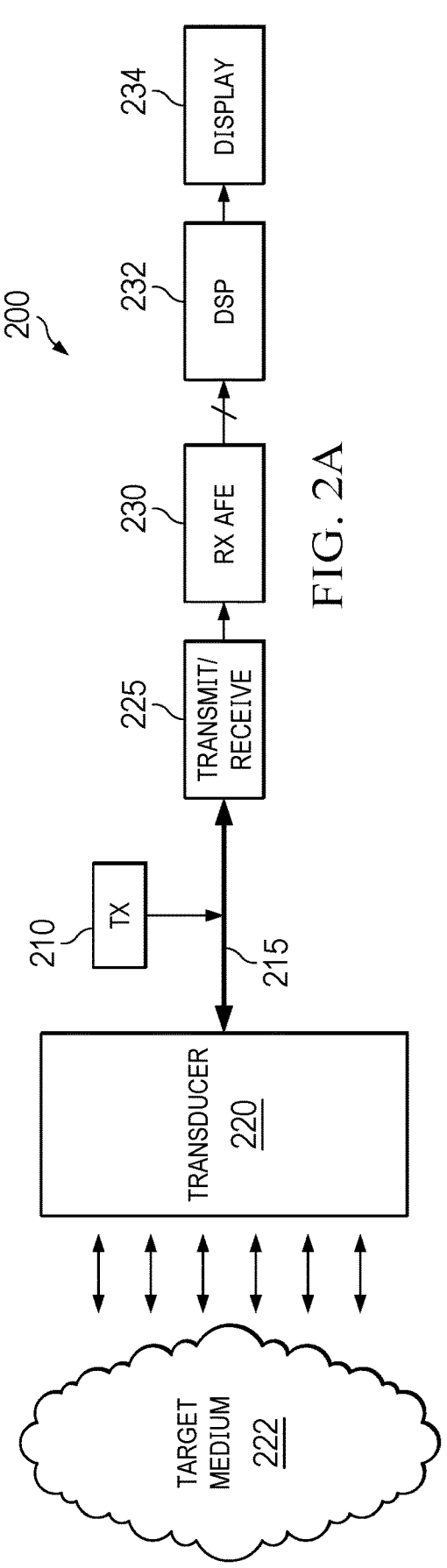
FIG. 2A is an electrical diagram, in block form, of an example of an ultrasonic transceiver system.

FIG. 2A illustrates an example of an ultrasonic transceiver system 200. Transceiver system 200 includes ultrasonic transmitter 210, signal bus 215, transducer 220, transmit/receive switch 225, receiver analog front-end (AFE) 230, digital signal processor (DSP) 232, and display 234. Transmitter 210, transmit/receive switch 225, receiver AFE 230, and digital signal processor 232 may each be implemented as one or more integrated circuits. Alternatively, two or more of transmitter 210, transmit/receive switch 225, receiver AFE 230, and digital signal processor 232 may be implemented into the same integrated circuit.

Ultrasonic transmitter 210 has an output coupled to ultrasonic transducer 220 by way of signal bus 215. Ultrasonic transducer 220 may include one or more piezoelectric or capacitively-driven ultrasonic transducer elements. Those transducer elements convert electrical energy into mechanical energy (e.g., acoustic waves) and vice versa. In system 200 of FIG. 2A, transducer 220 imparts mechanical energy into a target medium 222 (e.g., a human body) in response to electrical signals output by transmitter 210 and communicated via bus 215. Transducer 220 senses mechanical energy from the target medium and converts that mechanical energy into electrical signals. In this example, the mechanical energy sensed by transducer 220 may correspond to reflections of acoustic waves imparted by transducer 220 itself in response to electrical signals from transmitter 210. In system 200 of FIG. 2A, electrical signals generated by transducer 220 in response to sensing such reflections are output by transducer 220 onto bus 215. Bus 215 may correspond to a cable and other conductors (e.g., printed circuit board traces) that electrically couple transducer 220 to transmitter 210 and transmit/receive switch 225.

In the context of medical imaging, for example, transducer 220 may be arranged as a two-dimensional array of piezoelectric elements. Movement of such a transducer 220 along the surface of target medium 222 (e.g., along the skin of a human patient) can provide a two-dimensional image for diagnostic purposes. In this arrangement, transmitter 210 and receiver AFE 230 each include multiple transmit and receive channels, respectively, operating in parallel.

Transmit/receive switch 225 in system 200 is coupled between bus 215 and receiver AFE circuitry 230. Transmit/receive switch 225 isolates receiver AFE circuitry 230 from bus 215 during transmission periods and couples bus 215 to receiver AFE circuitry 230 during receive periods. In ultrasonic systems in which transducer efficiency is relatively low, the signals output by transmitter 210 may be at very high voltages and currents (e.g., 200V p-p at 6A p-p) relative to the amplitude (e.g., 500 mV pp) of the electrical signals output by transducer 220 in response to sensed reflections. The isolation provided by transmit/receive switch 225 can prevent the overdriving of input circuitry of receiver AFE 230 by the high voltage and current output of transmitter 210 in transmitting intervals. The particular placement of transmit/receive switch 225 may vary depending on the system architecture. For example, transmit/receive switch 225 may be placed between transmitter 210 and bus 215, or may be placed between transducer 220 and both of transmitter 210 and receiver AFE 230.

Receiver AFE 230 includes circuitry such as a low noise amplifier (LNA) to amplify the electrical signals from transducer 220, receiver filters to minimize receive path noise, comparators and/or threshold detectors to measure travel times of the acoustic reflections, analog-to-digital converter (ADC) circuitry, etc., as appropriate for the particular implementation. In system 200 of FIG. 2A, receiver AFE 230 outputs digital signals to digital signal processor (DSP) 232 for processing and display of results at display 234.

Figure 2B:
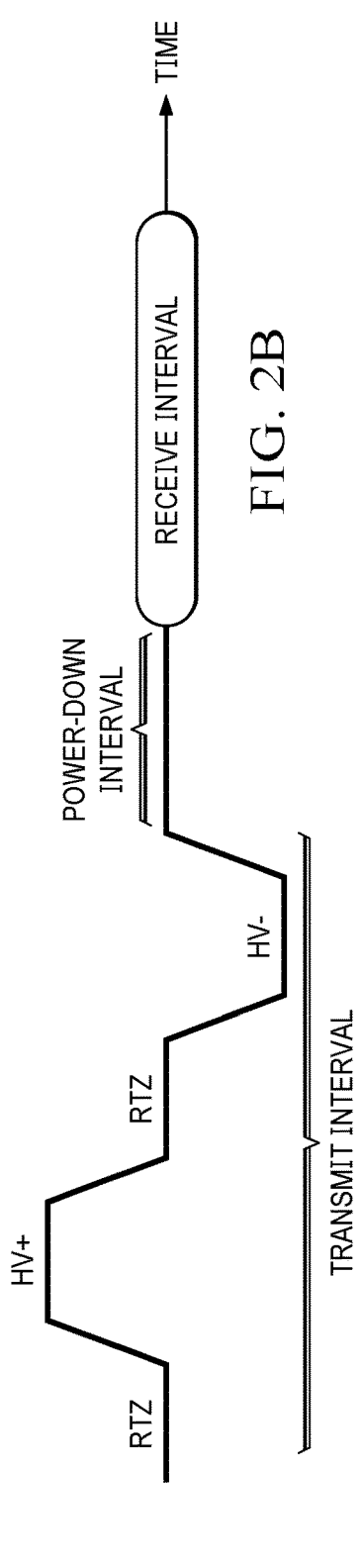
FIG. 2B is a timing diagram illustrating the operation of the ultrasonic transceiver system of FIG. 2A.

FIG. 2B illustrates an example of the operation of ultrasonic system 200 at signal bus 215 coupled to transducer 220. During transmit intervals in this example, transmitter circuitry 210 drives bus 215 with a periodic signal alternating between positive and negative high voltage levels, with a high impedance or "return-to-zero" (RTZ) phase between each half cycle. Transmit/receive switch 225 isolates the input of receiver AFE 230 from the output of transmitter 210 during this transmit interval. In a brief "power-down" interval following the transmit interval, transmitter 210 powers down, and transmit/receive switch 225 changes state to couple transducer 220 to receiver AFE 230. During receive intervals, receiver AFE 230 and DSP 232 receive and process reflections of the transmitted signal for output at display 234.

In ultrasonic medical imaging systems, for example, near-field imaging necessitates the rapid power-down of linear amplifier circuitry in the transmitter after the end of the transmit interval. For example, a typical power-down interval is as short as on the order of 200 nsec. Such rapid power-down, and similarly rapid power-up, of amplifier circuitry in the transmitter can generate transient glitches in the signal at the input of the transducer. Those glitches can cause the transducer to produce secondary transmissions that confound the sensed reflections and thus degrade image quality.

Figure 1A:
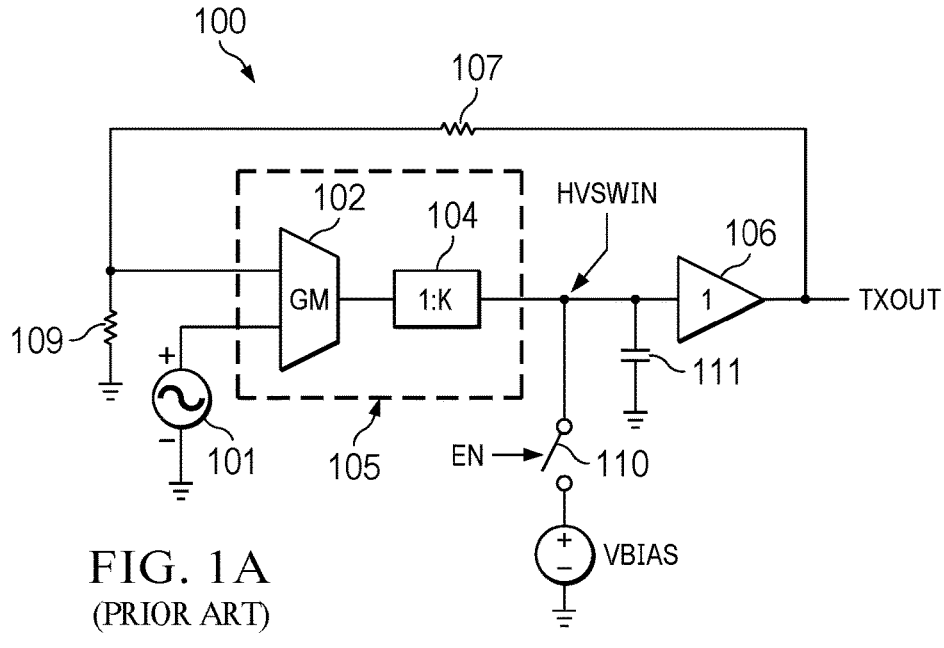
FIG. 1A is an electrical diagram, in block form, of an ultrasonic transmitter according to the prior art.

In some implementations such as the example of FIG. 1A, high voltage switch 110 is provided to reduce these transient glitches at the output of transmitter 100. During receive intervals, high voltage switch 110 is closed to hold the input of output stage 106 at a bias voltage VBIAS. Bias voltage VBIAS is selected to minimize transients as transmitter 100 is powered-up at the beginning of a transmit interval.

High voltage switch 110 desirably conducts minimal AC non-linear current when open during transmit intervals. In the open condition of switch 110 of FIG. 1B, transistors 120 and 124 in the first leg are both in an off state, and appear as back-to-back diodes 121, 125, respectively, between nodes HVSWIN and HVSWOUT. Similarly, transistors 130, 134 when turned off state appear as back-to-back diodes 131, 135 between nodes HVSWIN and HVSWOUT. Diodes 131, 135 are in the reverse orientation from diodes 121, 125. While each of these back-to-back diode pairs effectively block DC current through open switch 110 between nodes HVSWIN and HVSWOUT, non-linear current can be conducted.

Figure 1B:
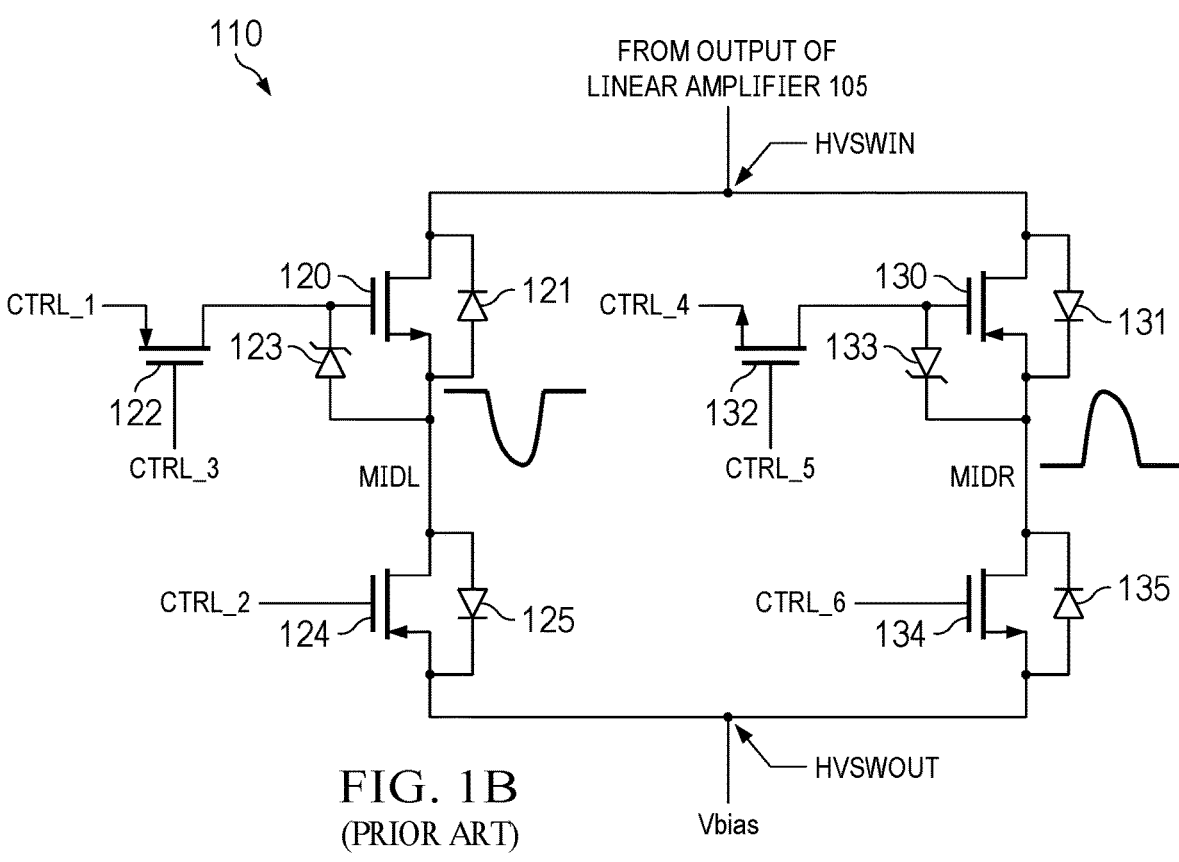
FIG. 1B is an electrical diagram, in schematic form, of a high voltage switch in the transmitter of FIG. 1A according to the prior art.

As illustrated in FIG. 1B, diode 121 is forward-biased when driver stage 104 drives a negative half-cycle, resulting in a negative pulse at mid node MIDL. Diode 125 is reverse-biased and blocks that negative pulse from passing to node HVSWOUT. Similarly, positive half-cycles from output stage 104 forward-bias diode 131, resulting in positive pulses at mid node MIDR. Diode 135 is reverse-biased by positive pulses at mid node MIDR, blocking current flow to node HVSWOUT. These unidirectional pulses at mid nodes MIDL, MIDR draw non-linear current from driver stage 104. This non-linear current appears as second harmonic distortion in the output signal from transmitter 100. In addition, parasitic capacitances are present in switch 110, for example at mid nodes MIDL, MIDR. The non-linear current drawn by these parasitic capacitances also appears as second harmonic distortion.

It is within this context that the examples described herein arise. One or more examples are described herein as implemented in ultrasonic transmitter circuitry, and provide particular benefits in that context. However, aspects of these examples may be beneficially applied in other applications in which a high voltage output signal is to be driven at high current and high frequencies. Accordingly, the following description is provided by way of example only.

Figure 3:
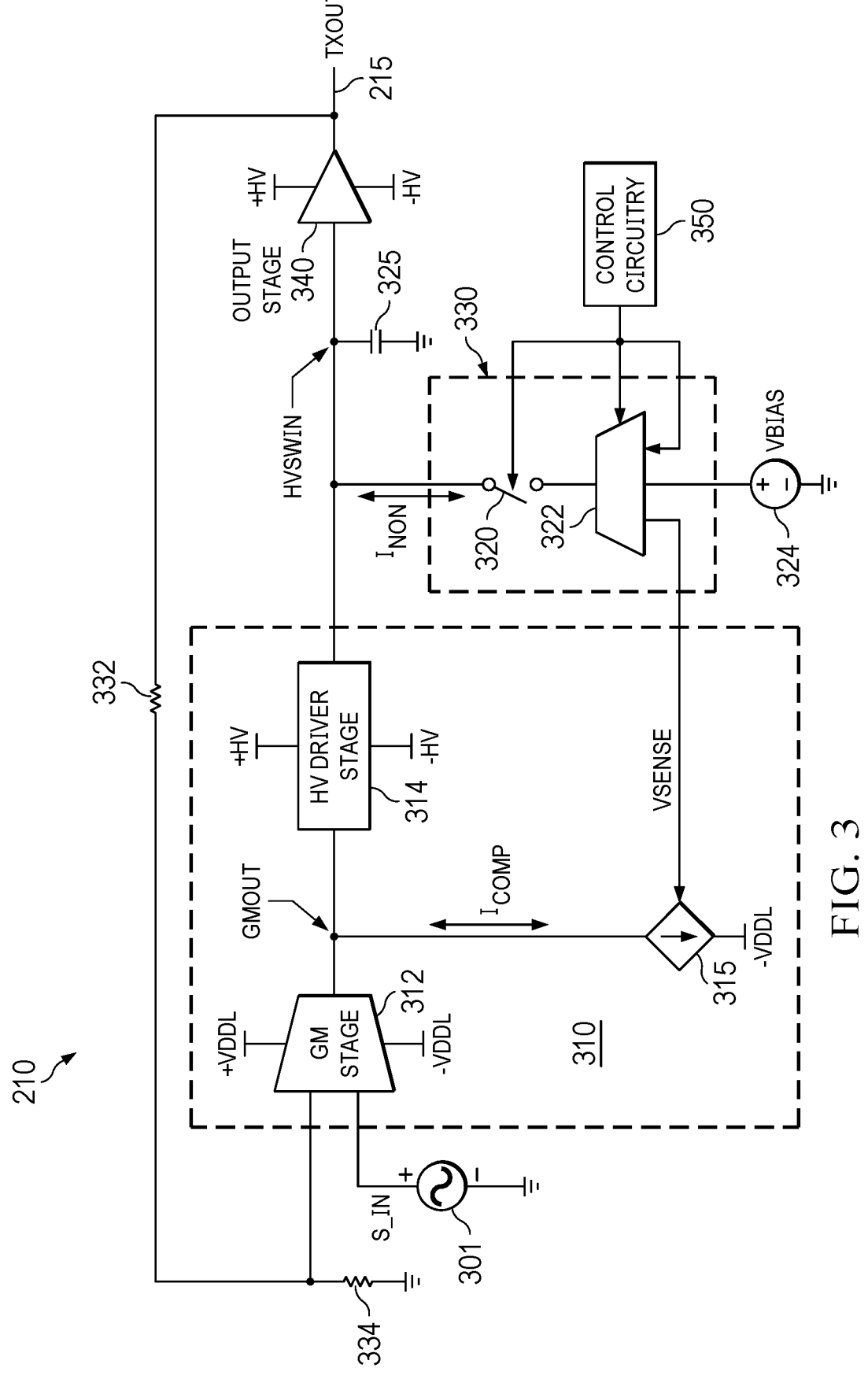
FIG. 3 is an electrical diagram, in block and schematic form, of an example of an ultrasonic transmitter in the system of FIG. 2A.

FIG. 3 illustrates an example of transmitter 210 of ultrasonic transceiver system 200. Transmitter 210 includes linear amplifier 310, output stage 340, and a feedback network of resistors 332, 334. Linear amplifier 310 includes first amplifier stage 312 and a second amplifier stage 314. In these examples, first amplifier stage 312 is implemented as a transconductance amplifier, and is referred to hereafter as transconductance amplifier 312, and second amplifier stage is implemented as a driver stage, and is referred to hereafter as driver stage 314. In other implementations, first and second amplifier stages 312 and 314 may be implemented according to alternative circuit arrangements as suitable for that implementation. Transmitter 210 further includes compensation circuit 315, compensation capacitor 325, high voltage switch 330, and control circuitry 350. Switch 330 includes switch circuitry 320 and select circuitry 322. An input signal source 301 and bias voltage generator 324 are implemented with transmitter 210. In these examples, current compensation circuit 315 is implemented as a compensation amplifier, and is referred to hereafter as compensation amplifier 315. However, current compensation circuit 315 can be constructed as any type of circuit that can compensate for a non-linear or AC current in switch circuitry 320 when switch circuitry 320 is in an open state.

Transmitter 210 as shown in FIG. 3 corresponds to a single transmitter channel, for example as coupled to a corresponding piezoelectric or capacitively-driven element of transducer 220 in system 200 of FIG. 2A. In implementations that include a transducer 220 with multiple elements, for example arranged as a two-dimensional array, multiple instances of transmitter 210 may be provided in system 200 for transmitting in parallel to those multiple transducer elements. Alternatively or in addition, a transmitter channel 210 may be used to simultaneously generate signals applied to more than one transducer element.

Transconductance amplifier 312 has a first, or signal, input coupled to input signal source 301. Input signal source 301 may be implemented as part of transmitter 210, or may be external to transmitter 210. Input signal source 301 generates an input signal S_IN, for example a periodic signal such as a sinusoid or square wave signal at the desired frequency (e.g., on the order of 25 MHZ). Transconductance amplifier 312 has a second, or feedback, input coupled to the output of output stage 340, for example at a node between feedback resistors 332 and 334. Transconductance amplifier 312 is biased from a positive power supply +VDDL and from a negative power supply −VDDL. An output of transconductance amplifier 312 is coupled to an input of high voltage driver stage 314. In this example, transconductance amplifier 312 converts a differential voltage at its input to an output current applied to driver stage 314.

High voltage driver stage 314 in this example is a current amplifier biased between a positive high voltage power supply +HV and a negative high voltage power supply −HV. An output of high voltage driver stage 314 is coupled to an input of output stage 340 at node HVSWIN. Compensation capacitor 325 is coupled between node HVSWIN and a ground terminal (e.g., at circuit ground). An output of output stage 340 is coupled to bus 215 for communication of output signal TXOUT to transducer 220. As noted above, the output of output stage 340 is coupled to series resistors 332 and 334 to provide feedback to transconductance amplifier 312.

In this example of ultrasonic system 200, transmitter 210 drives a high voltage, high current signal TXOUT to transducer 220. In this example, the high voltage power supplies +HV and −HV biasing driver stage 314 and output stage 340 have a higher amplitude (e.g., +90V, −90V, respectively) than power supply voltages +VDDL and −VDDL (e.g., +5V and −5V) applied to transconductance amplifier 312.

High voltage switch 330 of transmitter 210 is coupled to the input of output stage 340 at node HVSWIN. Switch 330 includes switch circuitry 320 coupled to node HVSWIN. Select circuitry 322 has one or more terminals coupled on one side to one or more nodes of switch circuitry 320, and has one or more terminals coupled on another side to bias voltage generator 324 to receive bias voltage VBIAS, to control circuitry 350, and to the control input of compensation amplifier 315 at node VSENSE. As used herein, a bias terminal (e.g., VBIAS) of the transmitter circuitry 210 refers to a terminal that may be coupled to the bias voltage generator 324 (when the bias voltage generator 324 is off chip from the transmitter circuitry 210) or refers to a terminal of the bias voltage generator 324 (when the bias voltage generator 324 is on chip with the transmitter circuitry 210). Control circuitry 350 has outputs coupled to switch circuitry 320 and select circuitry 322. In an example, control circuitry 350 includes logic circuitry that generates the appropriate control signals to selectively open and close switch circuitry 320, and to control select circuitry 322 to couple switch circuitry 320 to one of node VSENSE or the bias voltage VBIAS terminal. Control circuitry 350 may be implemented in whole or in part within transmitter 210, or alternatively as part of higher level control logic elsewhere in transceiver system 200.

Compensation amplifier 315 is coupled to the output of transconductance amplifier 312 at node GMOUT. Compensation amplifier 315 also has a control input coupled at node VSENSE to select circuitry 322 in switch 330. Compensation amplifier 315 in this example is a current amplifier that conducts a compensation current $I_{COMP}$ to node GMOUT. As described below, compensation amplifier 315 generates compensation current $I_{COMP}$ in response to a non-linear current $I_{NON}$ conducted by switch 330 in its open state. A measure of this non-linear current $I_{NON}$ is communicated from switch 330 via node VSENSE.

In operation during receive intervals according to this example, transmitter 210 is powered down to the extent practicable. For example, the components of linear amplifier 310 and output stage 340 may be powered down. Control circuitry 350 closes switch 330 in receive intervals, and selects the bias voltage terminal VBIAS for coupling to switch circuitry 320. The particular level of bias voltage VBIAS depends on the construction of output stage 340 and other circuitry in transmitter 210. For an example in which output stage includes a source follower stage with both PMOS and NMOS transistors, bias voltage VBIAS is the difference between gate-to-source voltages at the PMOS and NMOS transistors in output stage 340 (e.g., $V_{gsN}$−$V_{gsP}$).

In the operation of a transmit interval according to this example, transconductance amplifier 312 outputs a current at node GMOUT corresponding to a voltage differential at its inputs between input signal S_IN and a feedback signal from output stage 340. This current is applied to high voltage driver stage 314. Driver stage 314 outputs a high voltage signal at node HVSWIN corresponding to the current from transconductance amplifier 312. Switch 330 is open during this transmit interval. Driver stage 314 drives a current at its output (node HVSWIN) corresponding to the current from transconductance amplifier 312, amplified by a gain K. The output current from driver stage 314 is applied to output stage 340. Output stage 340 drives a high voltage, high current, linear output signal TXOUT onto bus 215 in response to the signal output by linear amplifier 310. As noted above, the voltage and current levels of output signal TXOUT may be selected according to the efficiency of the ultrasonic transducer. In some implementations, output signal TXOUT from output stage 340 may be at high voltages and currents as high as 200V p-p and 6A p-p.

To attain high resolution imaging by this example of ultrasonic transceiver system 200, the effect of non-linear components in the output current from linear amplifier 310 should be minimized. Transmitter 210 includes a compensation loop including high voltage switch 330 and compensation amplifier 315 to provide compensation for these non-linear components.

Figure 4A:
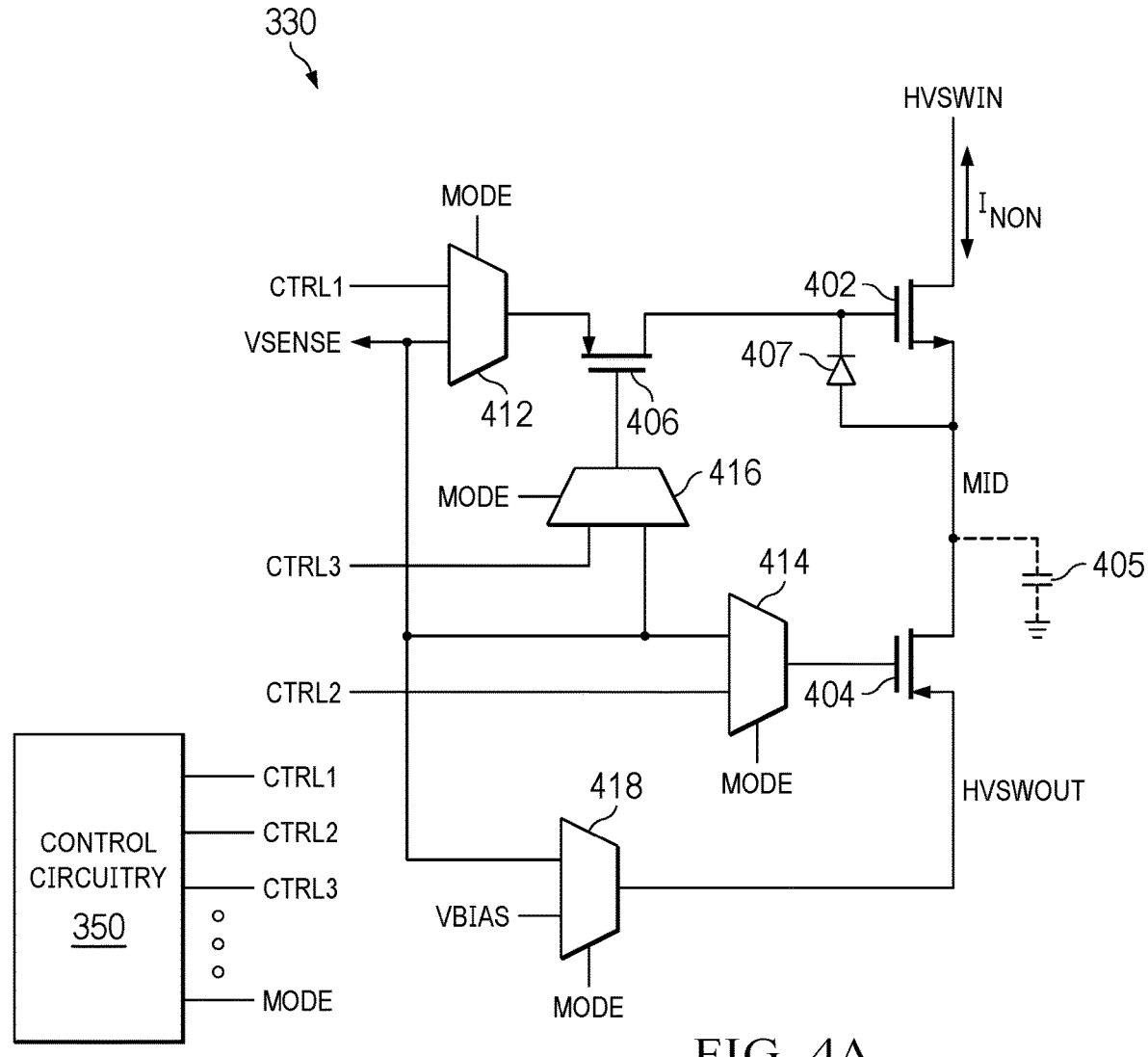
FIG. 4A is an electrical diagram, in schematic form, of an example of a high voltage switch in the transmitter of FIG. 3.

During transmit intervals, control circuitry 350 controls select circuitry 322 to provide the appropriate control signals to open switch 330 and couple one or more nodes in switch 330 to node VSENSE and thus to compensation amplifier 315. FIG. 4A schematically illustrates an example of switch 330. Switch 330 in this example includes NMOS transistor 402, PMOS transistors 404 and 406, Zener diode 407, and multiplexers 412, 414, 416, and 418. Transistors 402, 404, 406, and Zener diode 407 correspond to switch circuitry 320 (FIG. 3). Multiplexers 412, 414, 416, 418 correspond to select circuitry 322 (FIG. 3).

FIG. 4A illustrates switch 330 in an arrangement including a single conductive leg including NMOS transistor 402 and PMOS transistor 404 coupled in series between node HVSWIN and node HVSWOUT. NMOS transistor 402 has a drain coupled to node HVSWIN and a source coupled to a drain of PMOS transistor 404 at node MID. PMOS transistor 404 has a source coupled to node HVSWOUT. In this example in which node HVSWIN may present high voltage levels (e.g., with a voltage swing of +90V), transistors 402 and 404 (among others) may be constructed as high-voltage MOS transistors, for example as drain-extended MOS (DEMOS) devices.

PMOS transistor 406 has a drain coupled to the gate of NMOS transistor 402, and a source coupled to a terminal of multiplexer 412. Zener diode 407 has an anode coupled to node MID and a cathode coupled to the gate of NMOS transistor 402. Zener diode 407 limits the gate-to-source voltage of NMOS transistor 402, for example to a voltage of 5V. The gate of PMOS transistor 404 is coupled to one side of multiplexer 414. The gate of PMOS transistor 406 is coupled to a terminal of multiplexer 416. Node HVSWOUT is coupled to one side of multiplexer 418.

According to this example, multiplexers 412, 414, 416, 418 couple nodes in switch 330 to node VSENSE during transmit intervals. More particularly, multiplexer 412 in this example, selectively couples node VSENSE or control signal CTRL1 from control circuitry 350 to the source of PMOS transistor 406, under the control of MODE signal from control circuitry 350. Multiplexer 414 selectively couples node VSENSE or control signal CTRL2 from control circuitry 350 to the gate of PMOS transistor 404, under the control of MODE signal from control circuitry 350. Multiplexer 416 selectively couples node VSENSE or control signal CTRL3 from control circuitry 350 to the gate of PMOS transistor 406, under the control of MODE signal from control circuitry 350. Multiplexer 418 selectively couples node VSENSE or the bias voltage VBIAS terminal to the source of PMOS transistor 404, at node HVSWOUT, under the control of MODE signal from control circuitry 350.

Control circuitry 350 operates in receive intervals to issue MODE signals to multiplexers 412, 414, 416 that cause selection of control signals CTRL1, CTRL2, CTRL3 for application to transistors 402, 404, and 406, and to drive those control signals CTRL1, CTRL2, CTLR3 to logic levels that turn on those transistors 402, 404, 406. Control circuitry 350 also operates in receive intervals to issue MODE signals to multiplexer 418 that causes its selection of bias voltage VBIAS to be coupled to the source of PMOS transistor 404. As a result of this selection, control signal CTRL3 is coupled to the gate of PMOS transistor 406 to turn it on. This allows control signal CTRL1 to be coupled to the gate of NMOS transistor 402, turning it on. Control signal CTRL2 is coupled to the gate of NMOS transistor 404 to turn it on. In this manner, switch 330 couples node HVSWIN to bias voltage VBIAS to maintain voltage VBIAS at the input of output stage 340 while transmitter 210 is powered down during receive intervals.

During transmit intervals according to this example, control circuitry 350 issues control signals CTRL1, CTRL2, CTRL3 to turn off transistors 402 and 404 (and also transistor 406). Also during transmit intervals, for example after switch 330 is open by transistors 402, 404 turning off, control circuitry 350 issues the appropriate MODE signals to multiplexers 412, 414, 416, 418 to couple available nodes in switch 330 to node VSENSE, and thus to compensation amplifier 315. To the extent that nodes in switch 330 are coupled to node VSENSE, non-linear current $I_{NON}$ sourced by linear amplifier 310 and conducted to those nodes is applied to the control input of compensation amplifier 315.

Figure 5:
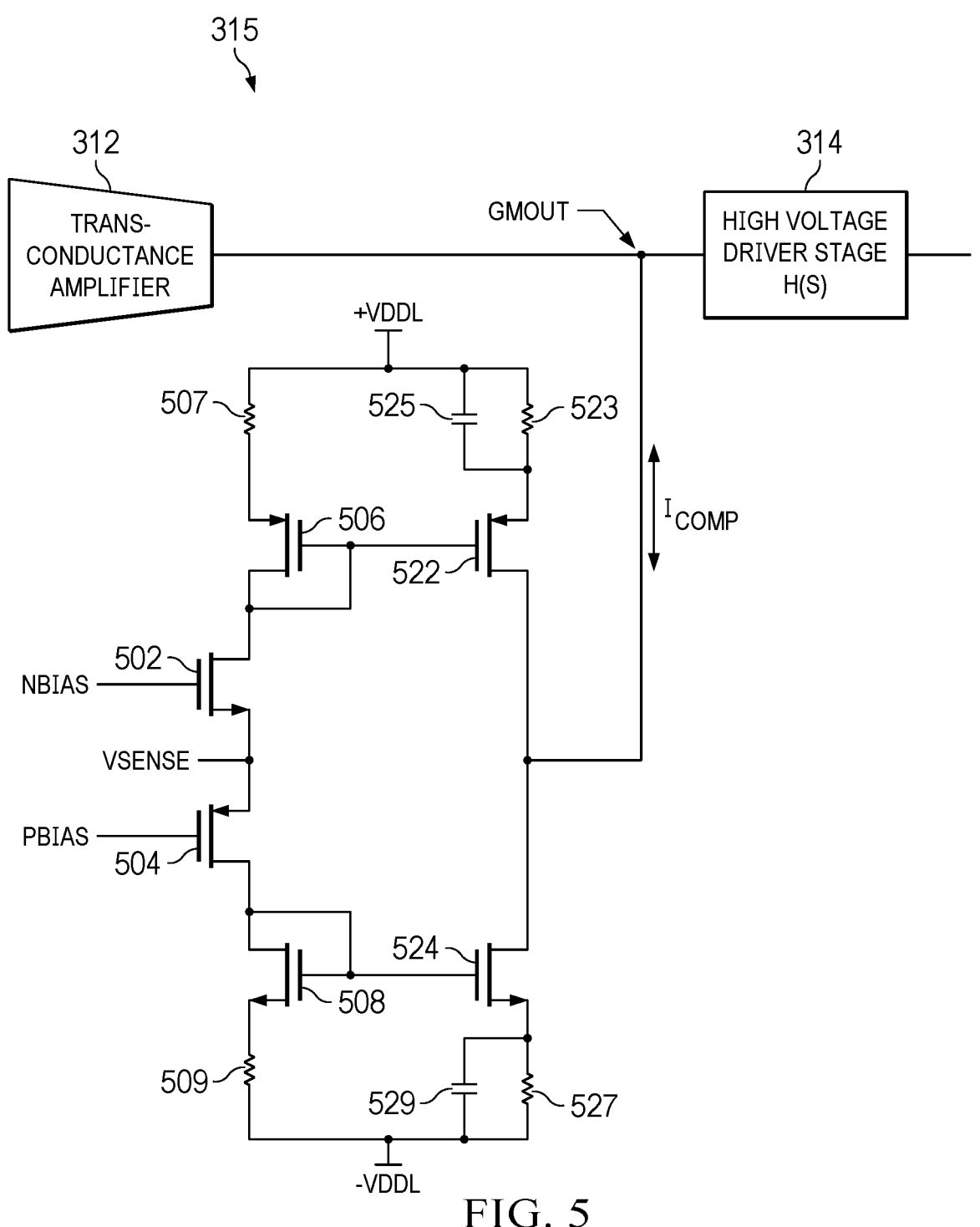
FIG. 5 is an electrical diagram, in schematic form, of an example of a compensation amplifier in the transmitter of FIG. 3.

FIG. 5 illustrates an example compensation amplifier 315. Compensation amplifier 315 includes NMOS transistors 502, 508, and 524; PMOS transistors 504, 506, and 522; resistors 507, 509, 523, and 527; and capacitors 525 and 529.

Compensation amplifier 315 is arranged as a PMOS current mirror in series with an NMOS current mirror between positive power supply +VDDL and negative power supply –VDDL. The PMOS current mirror of compensation amplifier 315 includes PMOS transistors 506 and 522. PMOS transistor 506 has a source coupled to power supply +VDDL via resistor 507. PMOS transistor 522 has a source coupled to power supply +VDDL via parallel-connected resistor 523 and capacitor 525. The gate and drain of PMOS transistor 506 are coupled together and to the gate of PMOS transistor 522. The gate and drain of PMOS transistor 506 are coupled to the drain of NMOS transistor 502. The drain of PMOS transistor 522 is coupled to node GMOUT at the output of transconductance amplifier 312 and the input of driver stage 314. Current conducted by PMOS transistor 506 is thus mirrored by a current through PMOS transistor 522, with a response corresponding to the values of resistor 523 and capacitor 525, and the size (e.g., channel width/length ratio) of transistor 522 relative to transistor 506.

NMOS transistor 502 has a gate receiving a bias voltage NBIAS, and a source coupled to node VSENSE. PMOS transistor 504 has a source coupled to node VSENSE and a gate receiving a bias voltage PBIAS. Bias voltages NBIAS and PBIAS are generated by reference voltage generator circuitry (not shown), for example at voltage levels selected to balance the currents conducted by the complementary current mirrors of compensation amplifier 315.

The NMOS current mirror of compensation amplifier 315 includes NMOS transistors 508 and 524. NMOS transistor 508 has a drain and gate coupled to the drain of PMOS transistor 504, and a source coupled to negative power supply –VDDL via resistor 509. NMOS transistor 524 has a drain coupled to the drain of PMOS transistor 522 at node GMOUT, and a source coupled to negative power supply –VDDL via parallel-connected resistor 527 and capacitor 529. The gate of NMOS transistor 524 is coupled to the gate and drain of NMOS transistor 508. Current conducted by NMOS transistor 509 is thus mirrored by a current through NMOS transistor 524, at a response corresponding to the values of resistor 527 and capacitor 529, and the size of transistor 524 relative to transistor 508.

In operation, non-linear current $I_{NON}$ conducted by switch 330 when open (e.g., during transmit intervals) is conducted to node VSENSE at the sources of NMOS transistor 502 and PMOS transistor 504. The voltage at node VSENSE thus corresponds to the polarity and amplitude of the non-linear current $I_{NON}$ as "sensed" by the coupling of nodes in switch 330 to node VSENSE. Compensation amplifier 315 generates a compensation current $I_{COMP}$ applied to node GMOUT in response to this voltage at node VSENSE (e.g., in response to the sensed non-linear current $I_{NON}$ conducted through switch 330). In this example, compensation current $I_{COMP}$ as applied to node GMOUT is of an opposite polarity from the sensed non-linear current $I_{NON}$ through switch 330, and at an amplitude that compensates for the sensed non-linear current $I_{NON}$ (when amplified by driver stage 314).

In a null condition, for example corresponding to open switch 330 conducting no non-linear current ($I_{NON}$=0), the voltage at node VSENSE is at a level at which current conducted by PMOS transistor 506 is substantially equal to current conducted by NMOS transistor 508. Bias voltages NBIAS and PBIAS may be calibrated to adjust this null voltage at node VSENSE. In this balanced state, the mirrored current conducted by PMOS transistor 522 is substantially equal to the mirrored current conducted by NMOS transistor 524. Compensation current $I_{COMP}$ from compensation amplifier 315 corresponds to the net differential between the currents conducted by PMOS transistor 522 and NMOS transistor 524. Accordingly, in the null or balanced state in which these currents are substantially equal, the net compensation current $I_{COMP}$ applied to node GMOUT is substantially zero.

If switch 330 is conducting a non-zero current $I_{NON}$ when open, the voltage at node VSENSE modulates accordingly. For example, the voltage at node VSENSE rises in response to switch 330 conducting a positive polarity current (e.g., from node HVSWIN to node HVSWOUT) in its open state. To the extent that the voltage at node VSENSE is higher than the null voltage, the gate-to-source voltage of NMOS transistor 502 is less than the gate-to-source voltage of PMOS transistor 504. This causes the current conducted by PMOS transistor 506 in the PMOS current mirror to be less than the current conducted by NMOS transistor 508 in the NMOS current mirror. A negative polarity net output current $I_{COMP}$ is thus applied by compensation amplifier 315 to node GMOUT, because the mirrored current conducted by NMOS transistor 524 is greater than the mirrored current conducted by PMOS transistor 522. Accordingly, a positive non-linear current conducted by open switch 330 results in a negative polarity compensation current $I_{COMP}$ from compensation amplifier 315.

Conversely, the voltage at node VSENSE falls below its null voltage in response to open switch 330 conducting a negative polarity current $I_{NON}$ (e.g., from node HVSWOUT to node HVSWIN). In this instance, to the extent that the voltage at node VSENSE is lower than the null voltage, the gate-to-source voltage of NMOS transistor 502 is greater than the gate-to-source voltage of PMOS transistor 504. This causes the current conducted by PMOS transistor 506 in the PMOS current mirror to be greater than the current conducted by NMOS transistor 508 in the NMOS current mirror. A positive polarity net output current $I_{COMP}$ is thus applied by compensation amplifier 315 to node GMOUT, because the mirrored current conducted by PMOS transistor 522 is greater than the mirrored current conducted by NMOS transistor 524. Accordingly, a negative non-linear current $I_{NON}$ conducted by open switch 330 results in a positive polarity compensation current $I_{COMP}$ from compensation amplifier 315.

In generating compensation current $I_{COMP}$, compensation amplifier 315 applies a gain G(s) to the sensed non-linear switch current communicated to node VSENSE. The compensation loop including driver stage 314, switch 330, and compensation amplifier 315 in this example is a positive feedback loop, requiring a loop gain of less than unity to maintain stability. The loop gain of this compensation loop in transmitter 210 can be considered as:

$$\text{loop gain} = G(s) * H(s) * \frac{C_H}{(C_H + C_C)} \qquad (1)$$

where H(s) is the transfer function of high voltage driver stage 314, $C_H$ is the effective capacitance of switch 330 in its open state, and $C_C$ is the capacitance of main loop compensation capacitor 325. In an example, capacitance $C_C$ of capacitor 325 is roughly ten times the effective capacitance $C_H$ of open switch 330. For instance, the loop gain according to equation (1) above for an implementation of transmitter 310 is on the order of −20 dB.

As shown in FIG. 5, compensation amplifier 315 includes capacitors 525 and 529 in the output legs of the PMOS and NMOS current mirrors. Capacitors 525, 529 have the effect of inserting a "zero" into gain G(s) of compensation amplifier 315. In one implementation, this zero roughly compensates for a "pole" in the transfer function H(s) of driver stage 314, helping to maintain a desired phase correction in the main loop. With such phase correction, the phase difference between the non-linear current $I_{NON}$ and compensation current $I_{COMP}$ can be kept small. In one example, the phase difference between non-linear current $I_{NON}$ and compensation current $I_{COMP}$ is <5°, resulting in better than 15 dB rejection.

In this example, compensation amplifier 315 is biased from the lower voltage power supply +VDDL (e.g., at about +5V) as compared with the high voltage power supplies +HV and −HV that bias driver stage 314 and output stage 340. This lower power supply voltage is available to compensation amplifier 315 because its output is coupled to the input of high voltage driver stage 314 at node GMOUT (rather than, e.g., being coupled to the output of driver stage 314). The generating of compensation current $I_{COMP}$ thus takes advantage of the gain K applied by driver stage 314. In addition, the lower voltage power supply +VDDL that biases compensation amplifier 315 enables its transistors to be constructed as logic transistors or in another lower voltage form. By implementing compensation amplifier 315 in the low voltage domain, delay and power consumption are kept quite small, especially as compared with implementation of this function in drain-extended or other high voltage transistor technologies.

Referring again to FIG. 4A, it is desirable that as many nodes in switch 330 as possible are coupled to node VSENSE and communicated to compensation amplifier 315. This allows compensation amplifier 315 to compensate for as many non-linear current paths as may exist within switch 330 when in its open state. Some nodes may not be available for such coupling, however, For example, transistors 402 and 404 give rise to a parasitic capacitance 405 at node MID. This parasitic capacitance 405 is charged and discharged by voltage swings at node HVSWIN while transistors 402 and 404 are turned off. That charging and discharging amounts to a non-linear current to node MID that cannot be readily compensated by compensation amplifier 315. In the arrangement of switch 330 shown in FIG. 4A having a single leg with NMOS transistor 402 coupled to node HVSWIN, this non-linear current will tend to be one-sided (e.g., of negative polarity).

Figure 4B:
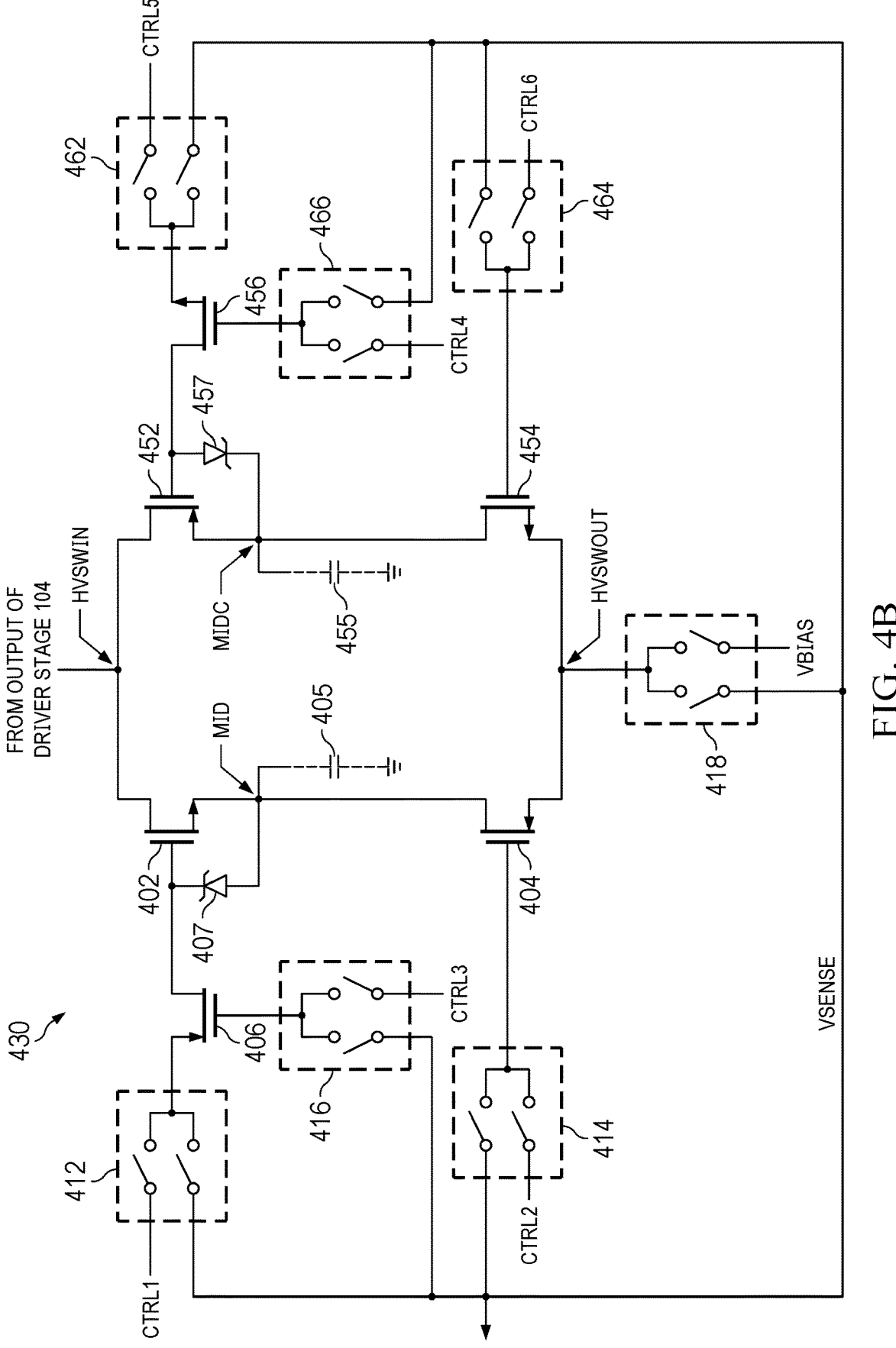
FIG. 4B is an electrical diagram, in schematic form, of another example of a high voltage switch in the transmitter of FIG. 3.

FIG. 4B illustrates high voltage switch 430 according to an example that limits the effect of this non-linear charging and discharging of parasitic capacitances. In this example, switch 430 is coupled between node HVSWIN and node HVSWOUT, replacing switch 330 in the arrangement of transmitter 210 shown in FIG. 2. Switch 430 includes each of the components and elements of switch 330, said components and elements referred to by the same reference numerals as used in FIG. 4A and coupled to one another as described above for switch 330. In addition, switch 430 includes a second conductive leg complementary to the single leg of switch 330, with that second complementary leg including PMOS transistor 452 and NMOS transistor 454. Switch 430 further includes NMOS transistor 456, Zener diode 457, and multiplexers 462, 464, 466.

Multiplexers 412, 414, 416, 418, 462, 464, 466 of switch 430 are shown in FIG. 4B in the form of paired switches. Control circuitry 350 (not shown in FIG. 4B) provides MODE signals and control signals CTRL1, CTRL2, CTRL3 as described above relative to FIG. 4A, and further provides control signals CTRL4, CTRL5, CTRL6 to multiplexers 466, 462, and 464, respectively, in switch 430.

PMOS transistor 452 has a drain coupled to node HVSWIN and a source coupled to a drain of NMOS transistor 454 at node MIDC. NMOS transistor 454 has a source coupled to node HVSWOUT. As such, the arrangement of PMOS transistor 452 and NMOS transistor 454 in the conductive leg between nodes HVSWIN and HVSWOUT is complementary to the conductive leg including NMOS transistor 402 and PMOS transistor 404. As described above, transistors 452 and 454 (among others) in switch 430 may be constructed as high-voltage MOS transistors, for example as DEMOS devices.

NMOS transistor 456 has a drain coupled to the gate of PMOS transistor 452, and a source coupled to a terminal of multiplexer 462. Zener diode 457 has an anode coupled to the gate of PMOS transistor 452 and a cathode coupled to node MIDC, to limit the gate-to-source voltage of PMOS transistor 452, for example to a voltage of −6V. The gate of NMOS transistor 454 is coupled to one side of multiplexer 464. The gate of NMOS transistor 456 is coupled to a terminal of multiplexer 466.

In switch 430 according to this example, multiplexers 412, 414, 416, 418, 462, 464, 466 are controlled by control circuitry 350 to couple nodes in switch 430 to node VSENSE during transmit intervals. Multiplexers 412, 414, 416, 418 operate as described above in connection with switch 330. In addition, multiplexer 462 in this example selectively couples node VSENSE or provides control signal CTRL5 from control circuitry 350 to the source of NMOS transistor 456, under the control of signals from control circuitry 350. Similarly, multiplexer 464 selectively couples node VSENSE or provides control signal CTRL6 from control circuitry 350 to the gate of NMOS transistor 454, under the control of signals from control circuitry 350. Multiplexer 466 selectively couples node VSENSE or provides control signal CTRL4 from control circuitry 350 to the gate of NMOS transistor 456, under the control of signals from control circuitry 350. Control circuitry 350 controls multiplexers 462, 464, 466, and control signals CTRL4, CTRL5, CTRL6 simultaneously and in the same manner as multiplexers 412, 414, 416, and control signals CTRL1, CTRL2, CTRL3, so that both conductive legs of switch 430 are in the same operating state at the same time.

The operation of switch 430 of this example corresponds to that described above for switch 330. In addition to the operation of switch 330 as described above, multiplexer 462 of switch 430 selectively couples node VSENSE or provides control signal CTRL4 from control circuitry 350 to the source of NMOS transistor 456, in response to a MODE signal (not shown) from control circuitry 350. Multiplexer 464 selectively couples node VSENSE or provides control signal CTRL6 from control circuitry 350 to the gate of NMOS transistor 454, under the control of MODE signal from control circuitry 350. Multiplexer 466 selectively couples node VSENSE or provides control signal CTRL4 from control circuitry 350 to the gate of NMOS transistor 456, under the control of MODE signal from control circuitry 350.

In receive intervals, control circuitry 350 issues the appropriate MODE signals to multiplexers 412, 414, 416, 462, 464, 466 to select their corresponding control signals CTRL1 through CTRL6. Control circuitry 350 also controls multiplexer 418 to provide bias voltage VBIAS to the source of PMOS transistor 404. In this condition, control signals CTRL1 through CTRL6 are driven by control circuitry 350 to turn on their corresponding transistors 402, 404, 406, 456, 452, 454, respectively, and thus close switch 430. When closed, switch 430 couples node HVSWIN to bias voltage VBIAS to maintain voltage VBIAS at the input of output stage 340 while transmitter 210 is powered down during receive intervals.

During transmit intervals according to this example, control circuitry 350 issues control signals CTRL1 through CTRL6 to turn off transistors 402, 404, 452, and 454, thus opening switch 430. After switch 430 is open, control circuitry 350 issues the appropriate signals to multiplexers 412, 414, 416, 418, 462, 464, and 466 to couple available nodes in switch 430 to node VSENSE, and thus to compensation amplifier 315. In this condition, non-linear current $I_{NON}$ sourced by linear amplifier 310 establishes a signal at node VSENSE that is communicated to the control input of compensation amplifier 315.

In this example, transistors 402 and 404 give rise to a parasitic capacitance 405 at node MID, and transistors 452 and 454 similarly give rise to a parasitic capacitance 455 at node MIDC. These parasitic capacitances 405 and 455 are charged and discharged by voltage swings at node HVSWIN while transistors 402 and 404, and transistors 452 and 454, are turned off. This charging and discharging amounts to a nonlinear current conducted to nodes MID and MIDC (which are not coupled to node VSENSE), and that thus cannot be readily compensated by compensation amplifier 315. But because of the complementary channel conductivity types of transistors 402 and 452 (NMOS and PMOS, respectively), nodes MID and MIDC are charged by currents of opposite polarities as described above relative to FIG. 1B. In this example, node MID is charged with a negative polarity current during negative half-cycles at node HVSWIN, and node MIDC is charged with a positive polarity current during positive half-cycles at node HVSWIN. These two currents tend to cancel out over time. Accordingly, the net uncompensated non-linear current conducted by switch 430 in its off state is much reduced in this example, by virtue of its complementary conductive legs.

Figure 6A:
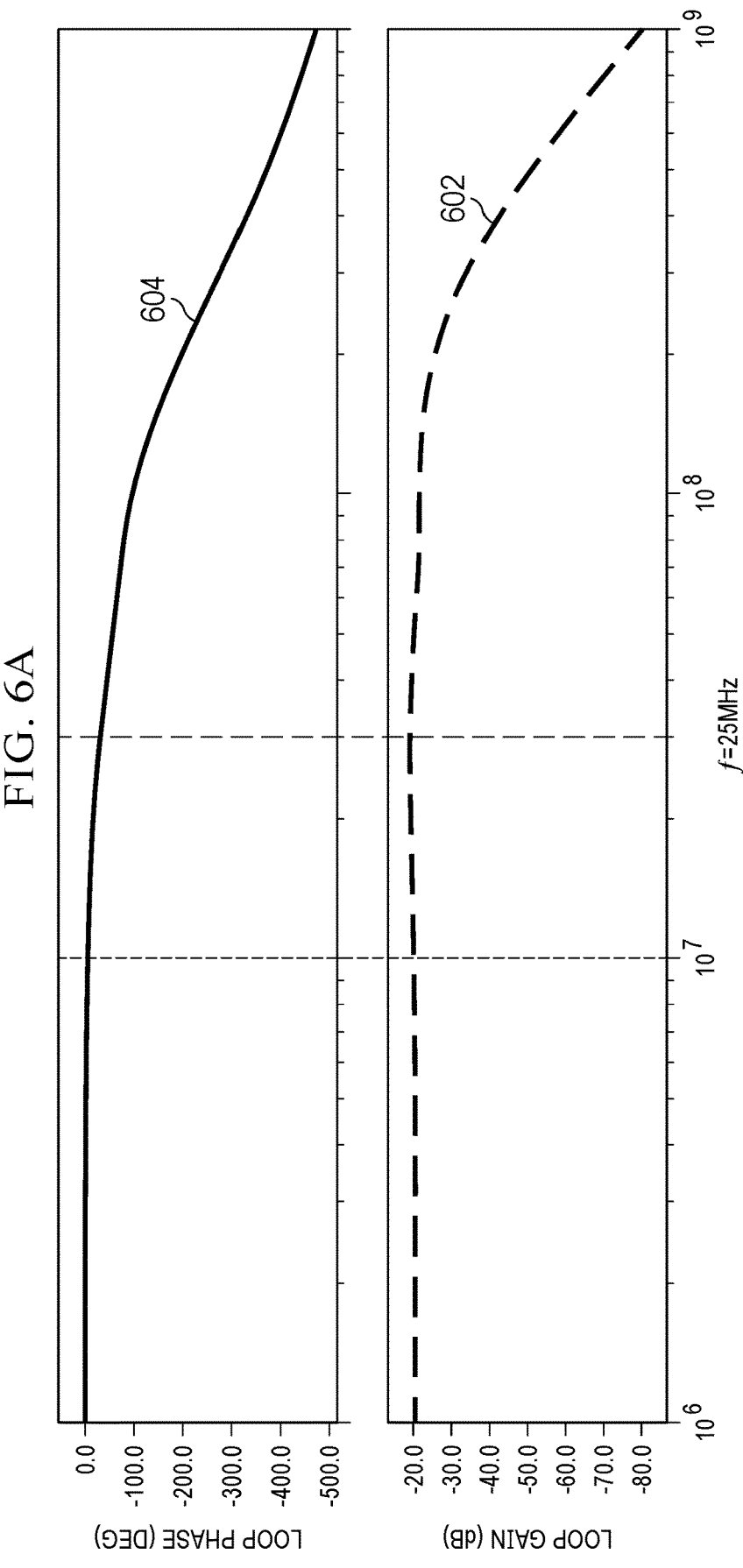
FIG. 6A illustrates plots of loop gain and phase for an example of the transmitter of FIG. 3.

FIG. 6A illustrates the loop gain and phase for an example of an ultrasonic transmitter 210 including a compensation loop of switch 430 in combination with compensation amplifier 315 described above. Curve 602 illustrates the loop gain over frequency for this example. This loop gain is maintained at −20 dB to ensure stability. Curve 604 similarly shows the loop phase over frequency for this example. As shown, the phase difference between the non-linear current $I_{NON}$ and compensation current $I_{COMP}$ is kept small over frequencies of interest, approaching only about 20° at the desired maximum operational frequency of 25 MHz, and less than that over the frequency range of interest.

Figure 6B:
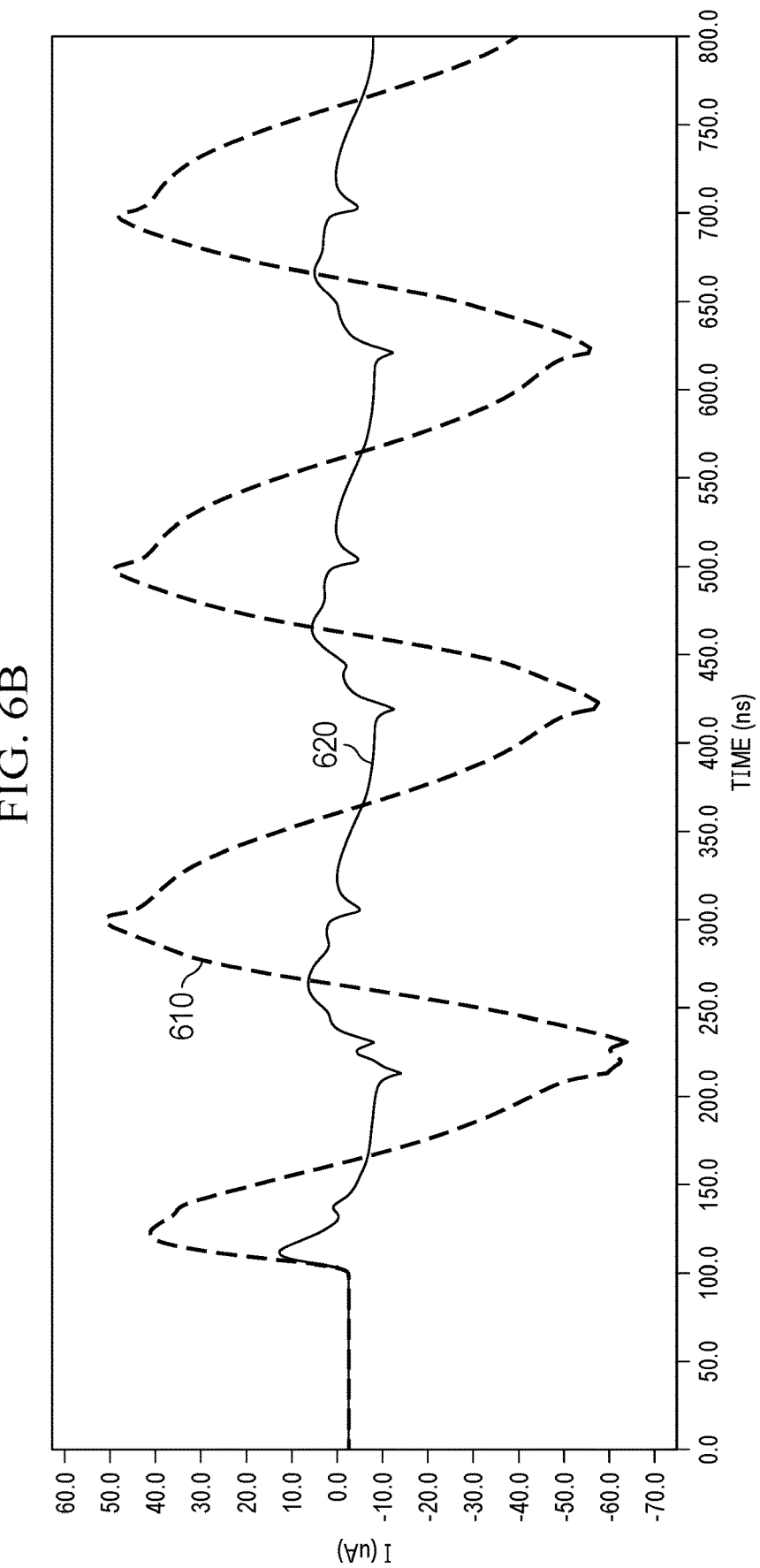
FIG. 6B illustrates a comparison of non-linear current conducted by a high voltage switch according to FIG. 4B in the transmitter of FIG. 3 as compared with current conducted by a high voltage switch according to FIG. 1B in the transmitter of FIG. 1A.

FIG. 6B illustrates a comparison of current conducted by the high voltage switch in the operation of an example of transmitter 210 including switch 430 as described above, with current conducted by the high voltage switch 110 in an example of a transmitter 100 as described above in connection with FIG. 1A and FIG. 1B. Curve 610 in FIG. 6B illustrates the current conducted over time by switch 110 of FIG. 1B within a transmit interval, at an operating frequency of about 5 MHz. As evident from curve 610, the amplitude of the current conducted by switch 110 is about +50 μA peak-to-peak. In contrast, the effective current flowing at node HVSWIN of high voltage switch 430 along with compensation current $I_{COMP}$ in transmitter 210 as described above has an amplitude of less than +10 μA peak-to-peak. This reduction in non-linear current conducted by high voltage switch 430 in an ultrasonic transmitter has been observed to improve linearity of the transmitter by as much as 12 dB or more.

Furthermore, when implemented in a high voltage, high current, high frequency application such as described above, the implementation of the compensation amplifier in the low voltage domain of the transmitter loop minimizes any additional power consumption added by the compensation amplifier. In one example, the power consumption of the correction loop is less than 15 mW, in an implementation in which the power consumption of the linear amplifier and output stage is on the order of 3 W. In addition, the compensation loop requires only minimal additional chip area (e.g., less than 0.1% of the chip area of the transmit channel in an example).

Figure 7:
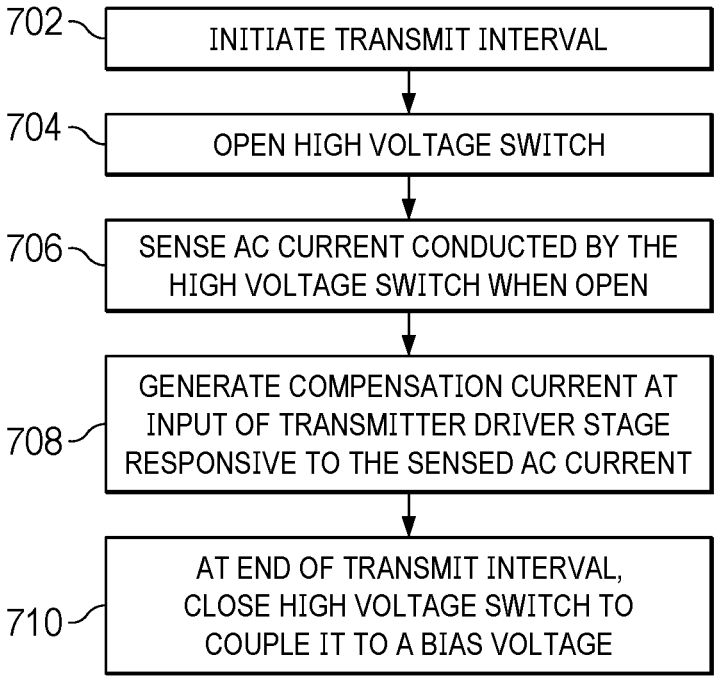
FIG. 7 is a flow diagram illustrating an example of a method of operating an ultrasonic transmitter.

FIG. 7 illustrates an example of a method of operating an ultrasonic transmitter 210 is according to the examples described above. While this example is described for an example in which transmitter 210 includes high voltage switch 430 of FIG. 4B, the same method of FIG. 7 may be used in transmitters including a single-sided high voltage switch such as switch 330 of FIG. 4A.

In process 702, a transmit interval is initiated, for example by powering up the linear amplifier 310 and output stage 340. Prior to process 702, control circuitry 350 has placed high voltage switch 430 in its closed state, such that the desired bias voltage VBIAS is provided to node HVSWIN at the input of driver stage 340. Upon the initiation of the transmit interval in process 702, control circuitry 350 issues the appropriate control signals (e.g., control signals CTRL1 through CTRL6) in process 704 to place high voltage switch 430 in its open state. Transmitter 210 is then operated to transmit the desired output signal at the appropriate voltage and current levels, and frequency, to transducer 220.

In process 706, the AC or non-linear current (e.g., current $I_{NON}$) that is conducted by high voltage switch 430 in its open state is sensed. In this example, process 706 entails the coupling of one or more nodes in the switch to a node VSENSE that is coupled to a control input of compensation amplifier 315. In the example of switch 430 described above, process 706 includes control circuitry 350 issuing control signals to multiplexers 412, 414, 416, 418, 452, 454, and 456 to couple corresponding nodes in switch 430 to node VSENSE. AC non-linear current $I_{NON}$ conducted by switch 430 during its open state in this transmit interval is thus conducted from those switch nodes, in the cumulative, to the control input of compensation amplifier 315 at node VSENSE.

In process 708, compensation amplifier 315 operates to produce a compensation current $I_{COMP}$, and to apply that current at node GMOUT, which in this example is the input of driver stage 314 of linear amplifier 310. As described above in this example, compensation amplifier 315 is implemented in the low voltage domain of transmitter 210. This allows the gain of driver stage 314 to amplify compensation current $I_{COMP}$ to a level that compensates for the non-linear current $I_{NON}$ driven at the output of driver stage 314. In an example, compensation amplifier 315 is arranged to have a transfer function with a zero at or near a pole frequency in the transfer function of driver stage 314. This maintains a loop gain that is relatively flat over the frequency range of interest (e.g., at about −20 dB) and with a small phase difference between the sensed non-linear current $I_{NON}$ and compensation current $I_{COMP}$.

At the end of the transmit interval, for example as transmitter 210 is powered down prior to a receive interval, process 710 is performed to close high voltage switch 430. The closing of switch 430 in process 710 is executed by control circuitry 350 issuing the appropriate signals to multiplexers 412, 414, 416, 418, 452, 454, and 456 to couple their corresponding nodes to receive control signals CTRL1 through CTRL6, and also issuing the appropriate signal to multiplexer 418 to couple node HVSWOUT to the bias voltage VBIAS terminal. Also in process 710, switch 430 is closed by control circuitry 350 issuing the appropriate logic levels at control signals CTRL1 through CTRL6 to turn on transistors 402, 404, 406, 452, 454, 456. Receiver circuitry 230 in the ultrasonic system may then receive electrical signals from transducer 220 indicating reflections of the transmitted ultrasonic energy from within the target medium 222.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means+/−10 percent of the stated value.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible within the scope of the claims.

What is claimed is:

1. Transmitter circuitry, comprising:
a linear amplifier, comprising:
   a first amplifier stage having a signal input, a feedback input, and an output; and
   a second amplifier stage having an input and an output, the input of the second amplifier stage coupled to the output of the first amplifier stage;
an output stage having an input and an output, the input of the output stage coupled to the output of the second amplifier stage, and the output of the output stage coupled to the feedback input of the first amplifier stage;
a transistor having a first current path terminal coupled to the output of the second amplifier stage and the input of the output stage;
a current compensation circuit having a current terminal and a control terminal, the current terminal of the current compensation circuit coupled to the output of the first amplifier stage and the input of the second amplifier stage; and
select circuitry having a first terminal, a second terminal, and a third terminal, the first terminal of the select circuitry coupled to a second current path terminal of the transistor, the second terminal of the select circuitry coupled to the control terminal of the current compensation circuit, the third terminal of the select circuitry coupled to a bias terminal of the transmitter circuitry, the select circuitry configured to couple the second current path terminal of the transistor to the bias terminal responsive to the transistor turning on, and to couple the second current path terminal of the transistor to the control terminal of the current compensation circuit responsive to the transistor turning off.

2. The transmitter circuitry of claim 1, wherein the transistor is a first transistor, the transmitter circuitry further comprising-switch comprises:
   a second transistor having a first current path terminal and a second current path terminal coupling the first current path terminal of the first transistor to the output of the second amplifier stage; and
   control circuitry having a first output coupled to a control terminal of the first transistor, the control circuitry having a second output coupled to a control terminal of the second transistor, the control circuitry configured to to turn on the first and second transistors during a receive interval and turn off the first and second transistors during a transmit interval.

3. The transmitter circuitry of claim 2, wherein the select circuitry comprises:
   first select circuitry coupled to the control terminal of the first transistor and the control terminal of the second transistor, the first select circuitry configured to selectively couple the control terminals of the first and second transistors to the control circuitry during the receive interval and to couple the control terminals of the first and second transistors to the control terminal of the current compensation circuit during at least a part of the transmit interval; and
   second select circuitry coupled to the second current path terminal of the first transistor and configured to couple the second current path terminal of the first transistor to the bias terminal during the receive interval and to couple the second current path terminal of the first transistor to the control terminal of the current compensation circuit during at least a part of the transmit interval.

4. The transmitter circuitry of claim 3, wherein the control circuitry is further configured to output a mode signal responsive the transmit interval and the receive interval at a mode output of the control circuitry;
wherein the second select circuitry comprises:
   a first multiplexer having a first terminal coupled to bias terminal, having a second terminal coupled to the control terminal of the current compensation circuit, having a third terminal coupled to the second current path terminal of the first transistor, and having a select input coupled to the mode output of the control circuitry, the first multiplexer configured to couple the third terminal of the first multiplexer to one of the first and second terminals of the first multiplexer responsive to the mode signal at the select input of the first multiplexer;
wherein the first select circuitry comprises:
   a second multiplexer having a first terminal coupled to the first output of the control circuitry, having a second terminal coupled to the control terminal of the current compensation circuit, having a third terminal coupled to the control terminal of the first transistor, and having a select input coupled to the mode output of the control circuitry, the second multiplexer configured to couple the third terminal of the second multiplexer to one of the first and second terminals of the second multiplexer responsive to the mode signal at the select input of the second multiplexer; and
   a third multiplexer having a first terminal coupled to the second output of the control circuitry, having a second terminal coupled to the control terminal of the current compensation circuit, having a third terminal coupled to the control terminal of the second transistor, and having a select input coupled to the mode output of the control circuitry, the third multiplexer configured to couple the third terminal of the third multiplexer to one of the first and second terminals of the third multiplexer responsive to the mode signal at the select input of the third multiplexer.

5. The transmitter circuitry of claim 2, further comprising:
   a third transistor having a first current path terminal coupled to the output of the second amplifier stage, having a second current path terminal coupled to the bias terminal and the control terminal of the current compensation circuit, and having a control terminal; and
   a fourth transistor having a first current path terminal and a second current path terminal coupling the first current path terminal of the third transistor to the output of the second amplifier stage, and having a control terminal, the third and fourth transistors configured as field-effect transistors of opposite channel conductivity types, the third transistor having an opposite channel conductivity type from the first transistor, and the fourth transistor having an opposite channel conductivity type from the second transistor;
   and wherein the control circuitry further has a third output coupled to the control terminal of the third transistor and a fourth output coupled to the control terminal of the fourth transistor, the control circuitry configured to turn on the third and fourth transistors during the receive interval and turn off the third and fourth transistors during the transmit interval.

6. The transmitter circuitry of claim 1, wherein the first amplifier stage is a transconductance amplifier biased from a first supply voltage;

wherein the second amplifier stage is a driver stage biased from a second supply voltage, the second supply voltage being a higher voltage than the first supply voltage.

7. The transmitter circuitry of claim 6, wherein the second amplifier stage and the output stage are biased between the second supply voltage at both positive and negative polarities.

8. The transmitter circuitry of claim 1, wherein the first amplifier stage is a transconductance amplifier;

wherein the second amplifier stage is a driver stage;

and wherein the current compensation circuit comprises:

a first current mirror having a first leg coupled between a first supply terminal and the control terminal of the current compensation circuit, and having a second leg coupled between the first supply terminal and the output of the first amplifier stage; and a second current mirror having a third leg coupled between the control terminal of the current compensation circuit and a second supply terminal, and having a fourth leg coupled between the output of the first amplifier stage and the second supply terminal.

9. The transmitter circuitry of claim 8, wherein the first current mirror comprises:

a first mirror transistor having a source coupled to the first supply terminal, having a gate, and having a drain;

a first bias transistor having a drain coupled to the gate and drain of the first mirror transistor, having a source coupled to the control terminal, and having a gate adapted to receive a first bias voltage; and a second mirror transistor having a source coupled to the first supply terminal, having a gate coupled to the gate and drain of the first mirror transistor, and having a drain coupled to the output of the first amplifier stage;

wherein the second current mirror comprises:

a third mirror transistor having a source coupled to the second supply terminal, having a gate, and having a drain;

a second bias transistor having a drain coupled to the gate and drain of the third mirror transistor, having a source coupled to the control terminal, and having a gate adapted to receive a second bias voltage;

a fourth mirror transistor having a source coupled to the second supply terminal, having a gate coupled to the gate and drain of the third mirror transistor, and having a drain coupled to the output of the first amplifier stage;

and wherein the current compensation circuit further comprises:

a first passive network coupled between the source of the second mirror transistor and the first supply terminal; and a second passive network coupled between the source of the fourth mirror transistor and the second supply terminal.

10. An ultrasonic transceiver system, comprising:

a transducer;

ultrasonic receiver circuitry, coupled to the transducer;

ultrasonic transmitter circuitry, having an output terminal coupled to the transducer;

a transmit/receive switch, coupled to the ultrasonic transmitter circuitry and to the ultrasonic receiver circuitry, and configured to isolate the ultrasonic receiver circuitry from the ultrasonic transmitter circuitry while the ultrasonic transmitter circuitry is transmitting;

wherein the ultrasonic transmitter circuitry comprises:

a linear amplifier, comprising:

a first amplifier stage having a signal input, a feedback input, and an output; and a second amplifier stage having an input and an output, the input of the second amplifier stage coupled to the output of the first amplifier stage;

an output stage having an input and an output, the input of the output stage coupled to the output of the second amplifier stage, and the output of the output stage coupled to the feedback input of the first amplifier stage;

a transistor having a first current path terminal coupled to the output of the second amplifier stage and the input of the output stage;

control circuitry having a first terminal coupled to a control terminal of the transistor;

a current compensation circuit having a current terminal and a control terminal, the current terminal of the current compensation circuit coupled to the output of the first amplifier stage and the input of the second amplifier stage; and a multiplexer having a first terminal coupled to a second current path terminal of the transistor, having a second terminal coupled to the control terminal of the current compensation circuit, and having a third terminal coupled to a bias terminal of the ultrasonic transmitter circuitry, the multiplexer configured to couple the second current path terminal of the transistor to the bias terminal responsive to the transistor turning on, and to couple the second current path terminal of the transistor to the control terminal of the current compensation circuit responsive to the transistor turning off.

11. The ultrasonic transceiver system of claim 10, wherein the transistor is a first transistor, the ultrasonic transmitter circuitry further comprising:

a second transistor having a current path coupled in series between the output of the second amplifier stage and the first current path terminal of the first transistor, the first and second transistors configured as field-effect transistors of opposite channel conductivity types;

and wherein the control circuitry comprises logic circuitry having outputs coupled to control terminals of the first and second transistors, the logic circuitry configured to turn on the first and second transistors during a receive interval and turn off the first and second transistors during a transmit interval.

12. The ultrasonic transceiver system of claim 10, wherein the multiplexer is a first multiplexer, the ultrasonic transceiver system further comprising:

a second multiplexer having a first terminal coupled to the first terminal of the control circuitry, having a second terminal coupled to the control terminal of the current compensation circuit, and having a third terminal coupled to the control terminal of the transistor, the second multiplexer configured to couple the control terminal of the transistor to the first terminal of the control circuitry, the second multiplexer configured to couple the control terminal of the transistor to the control terminal of the current compensation circuit responsive to the transistor turning off.

13. The ultrasonic transceiver system of claim 10, wherein the first amplifier stage is a transconductance amplifier biased from a first supply voltage;

wherein the second amplifier stage is a driver stage biased from a second supply voltage, the second supply voltage being a higher voltage than the first supply voltage.

14. The ultrasonic transceiver system of claim 10, wherein the current compensation circuit comprises:

a first current mirror, comprising:

a first mirror transistor having a source coupled to a first supply terminal, having a gate, and having a drain;

a first bias transistor having a drain coupled to the gate and drain of the first mirror transistor, having a source coupled to the control terminal, and having a gate adapted to receive a first bias voltage; and a second mirror transistor having a source coupled to the first supply terminal, having a gate coupled to the gate and drain of the first mirror transistor, and having a drain coupled to the output of the first amplifier stage;

a second current mirror, comprising:

a third mirror transistor having a source coupled to a second supply terminal, having a gate, and having a drain;

a second bias transistor having a drain coupled to the gate and drain of the third mirror transistor, having a source coupled to the control terminal, and having a gate adapted to receive a second bias voltage;

a fourth mirror transistor having a source coupled to the second supply terminal, having a gate coupled to the gate and drain of the third mirror transistor, and having a drain coupled to the output of the first amplifier stage;

a first compensation network coupled between the source of the second mirror transistor and the first supply terminal; and a second compensation network coupled between the source of the fourth mirror transistor and the second supply terminal.

15. A method, comprising:

generating a first signal with a transconductance amplifier;

amplifying the first signal with a driver stage, thereby generating a second signal;

generating an output signal responsive to the second signal with an output stage, the output stage having an output coupled to a transducer;

turning off a transistor in response to initiating a transmit interval, the transistor having a first current path terminal coupled to an output of the driver stage;

coupling a second current path terminal of the transistor to a control terminal of a compensation circuit with a multiplexer in response to turning off the transistor;

sensing a current through the first and second current path terminals of the transistor with the compensation circuit in response to coupling the second current path terminal of the transistor to the control terminal of the compensation circuit;

generating a compensation current responsive to the sensed current with the compensation circuit; and modifying the first signal with the compensation current.

16. The method of claim 15, wherein the transconductance amplifier outputs the first signal to an input of the driver stage, and wherein generating the compensation current and modifying the first signal with the compensation current comprises:

outputting the compensation current to the input of the driver stage via an output terminal of the compensation circuit.

17. The method of claim 16, further comprising:

coupling the second current path terminal of the transistor to a bias terminal with the multiplexer in response to transitioning from the transmit interval to a receive interval;

turning on the transistor in response to coupling the second current path terminal of the transistor to the bias terminal; and modifying the second signal with a bias signal in response to turning on the transistor.

18. The method of claim 17, further comprising:

coupling a control terminal of the transistor to the control terminal of the compensation circuit in response to turning off the transistor.

19. The method of claim 18, further comprising:

coupling the control terminal of the transistor to control circuitry in response to transitioning from the transmit interval to the receive interval.

20. The method of claim 15, wherein the first signal has a first current, and wherein modifying the first signal with the compensation current comprises adding the compensation current to the first current.

* * * * *